United States Patent
Sainoo et al.

(10) Patent No.: US 8,609,983 B2
(45) Date of Patent: Dec. 17, 2013

(54) INTERCONNECTION SHEET, SOLAR CELL WITH INTERCONNECTION SHEET, SOLAR CELL MODULE, AND INTERCONNECTION SHEET ROLL

(75) Inventors: Yasushi Sainoo, Osaka (JP); Akiko Tsunemi, Osaka (JP); Tomohiro Nishina, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/381,496

(22) PCT Filed: Jun. 24, 2010

(86) PCT No.: PCT/JP2010/060720
§ 371 (c)(1),
(2), (4) Date: Dec. 29, 2011

(87) PCT Pub. No.: WO2011/001883
PCT Pub. Date: Jan. 6, 2011

(65) Prior Publication Data
US 2012/0103415 A1  May 3, 2012

(30) Foreign Application Priority Data
Jun. 29, 2009 (JP) ................................. 2009-153553

(51) Int. Cl.
*H01L 25/00* (2006.01)
*H01L 25/03* (2006.01)
*H01L 33/00* (2010.01)

(52) U.S. Cl.
USPC ......................................... 136/256; 136/244

(58) Field of Classification Search
USPC ........................................................ 136/256
See application file for complete search history.

(56) References Cited

U.S. PATENT DOCUMENTS

| 5,951,786 | A | 9/1999 | Gee et al. |
|---|---|---|---|
| 2005/0082655 | A1 | 4/2005 | Nishi et al. |
| 2006/0270114 | A1 | 11/2006 | Nishi et al. |
| 2007/0261731 | A1* | 11/2007 | Abe et al. ...................... 136/244 |
| 2010/0126551 | A1* | 5/2010 | Okamoto et al. ............. 136/244 |

(Continued)

FOREIGN PATENT DOCUMENTS

| EP | 2211389 | 7/2010 |
|---|---|---|
| JP | 2005-175436 | 6/2005 |

(Continued)

OTHER PUBLICATIONS

International Search Report for PCT/JP2010/060720, mailed Sep. 28, 2010.

(Continued)

*Primary Examiner* — Jonathan Johnson
*Assistant Examiner* — Bethany Lambright
(74) *Attorney, Agent, or Firm* — Nixon & Vanderhye P.C.

(57) ABSTRACT

An interconnection sheet, a solar cell with the interconnection sheet, a solar cell module, an interconnection sheet roll, a solar cell with an interconnection sheet and solar cell module satisfy a relationship of Y≤Z<X, where X represents a maximum linear distance in a first direction from a connection portion connecting a wire for n type and a first connecting wire to a connection portion connecting a wire for p type and a second connecting wire, Y represents a maximum length of an alternating array portion in the first direction, and Z represents a maximum length of the alternating array portion in a second direction.

3 Claims, 11 Drawing Sheets

(56) References Cited

U.S. PATENT DOCUMENTS

| | | | |
|---|---|---|---|
| 2010/0258162 A1* | 10/2010 | O'Brien et al. | 136/251 |
| 2010/0263718 A1* | 10/2010 | Abiko | 136/252 |
| 2010/0263719 A1* | 10/2010 | Straub et al. | 136/256 |

FOREIGN PATENT DOCUMENTS

| | | | | |
|---|---|---|---|---|
| JP | 2005-340362 | 12/2005 | | |
| JP | 2009-130116 | 6/2009 | | |
| WO | WO 2009/041212 | 4/2009 | | |
| WO | WO2009060753 | * 5/2009 | | 136/252 |

OTHER PUBLICATIONS

European Search Report issued for corresponding European Patent Application No. 10794052.0-1528, dated Nov. 9, 2012.

* cited by examiner

FIG.9
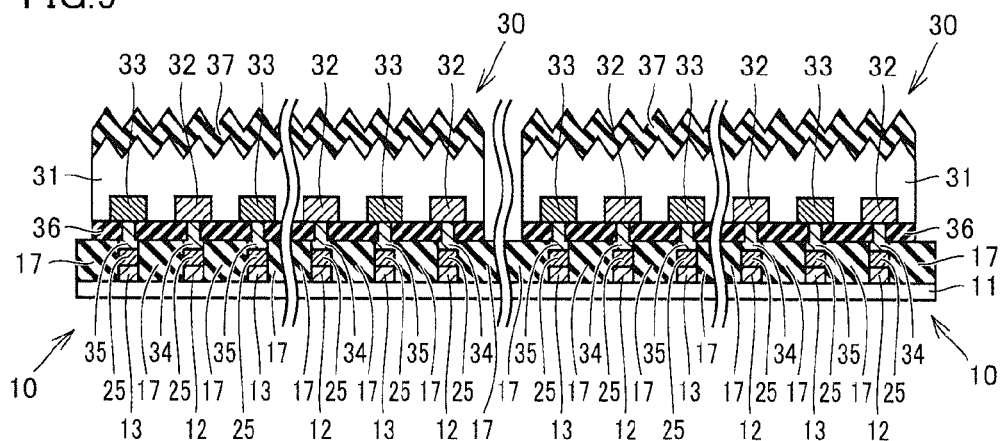
FIG.10
(a)
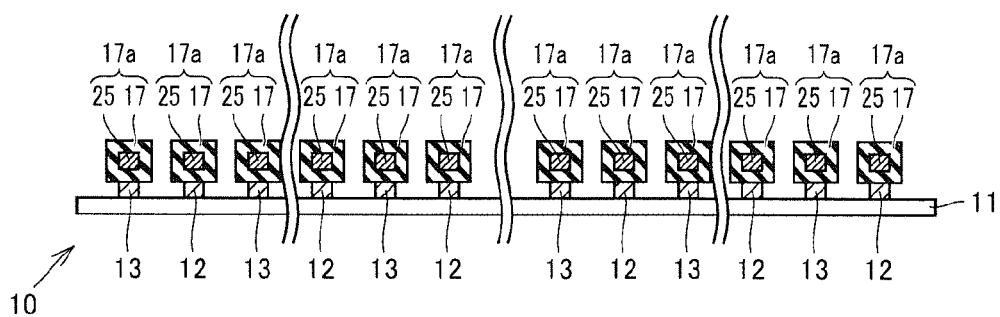
(b)
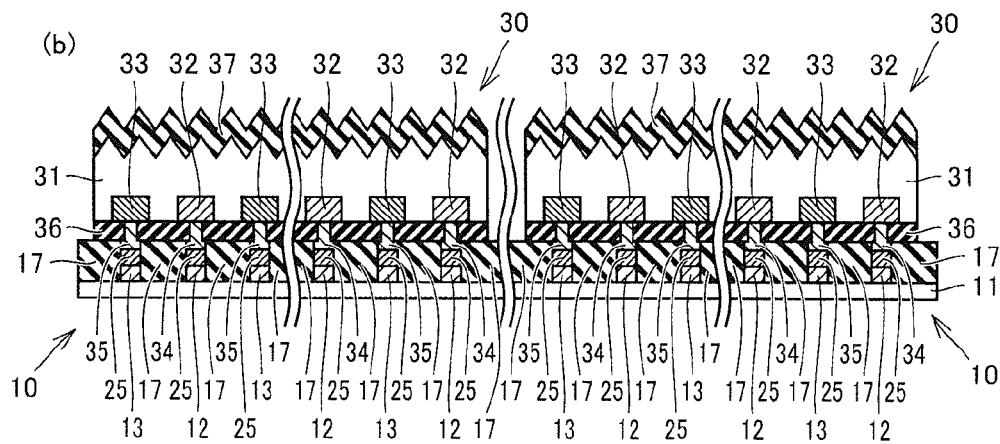

FIG.13
(a)
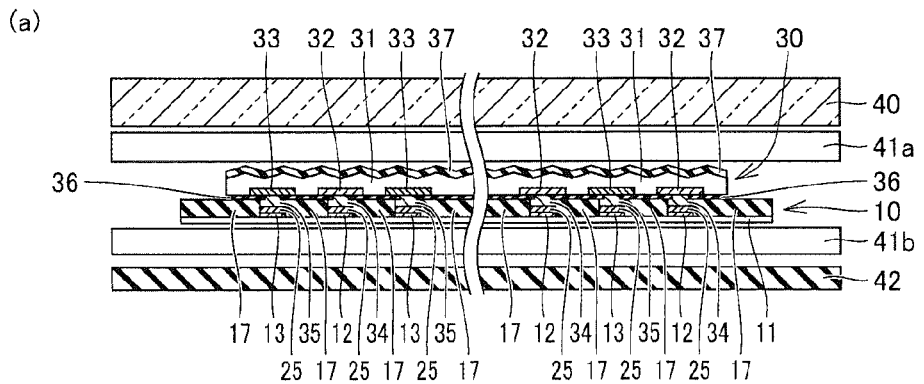
(b)
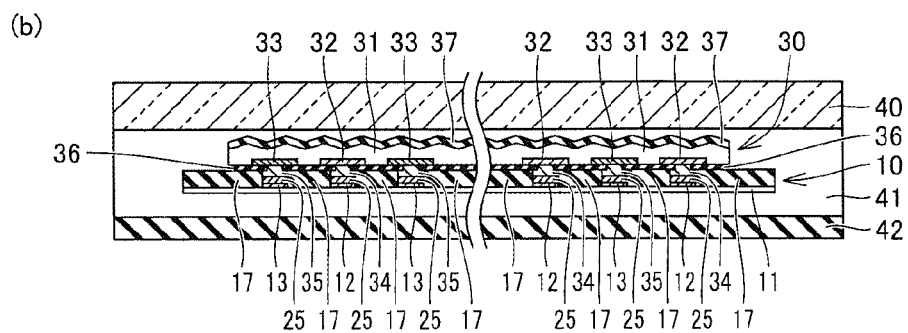
FIG.14
(a)
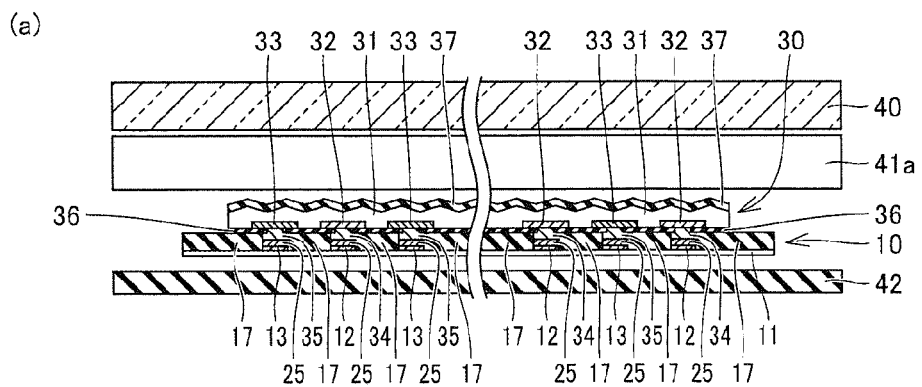
(b)
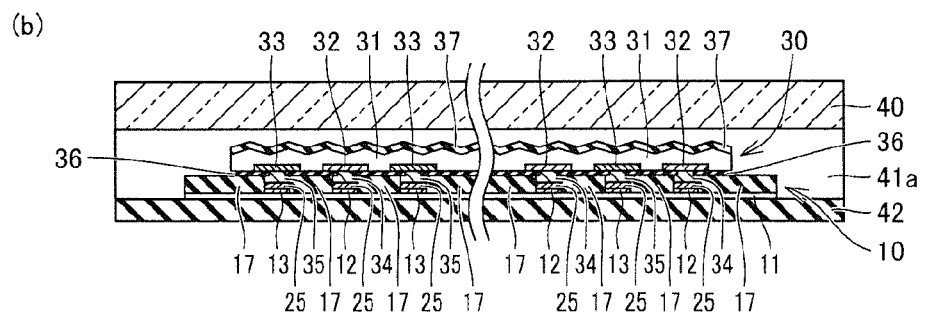

INTERCONNECTION SHEET, SOLAR CELL WITH INTERCONNECTION SHEET, SOLAR CELL MODULE, AND INTERCONNECTION SHEET ROLL

This application is the U.S. national phase of International Application No. PCT/JP2010/060720, filed 24 Jun. 2010, which designated the U.S. and claims priority to Japan Application No. 2009-153553, filed 29 Jun. 2009, the entire contents of each of which are hereby incorporated by reference.

TECHNICAL FIELD

The present invention relates to an interconnection sheet, a solar cell with the interconnection sheet, a solar cell module, and an interconnection sheet roll.

BACKGROUND ART

In recent years, development of clean energy is demanded for environmental issues such as depletion of energy resources, increase of $CO_2$ in the atmosphere, and the like, and in particular, solar photovoltaic power generation employing solar cell modules are developed, put to practical use and advanced as a new energy resource.

As a solar cell, which configures a solar cell module, a bifacial electrode type solar cell, which has for example a monocrystalline or polycrystalline silicon substrate having a photoreceiving surface with an impurity of a conductivity type opposite to that of the silicon substrate to provide a pn junction, and a back surface opposite to the photoreceiving surface, with the surfaces provided with electrodes, respectively, has conventionally been the mainstream. Furthermore, in recent years, a solar cell having a silicon substrate having a back surface with both an electrode for p type and an electrode for n type, i.e., a so called back electrode type solar cell, is also being developed.

For example, Patent Literature 1 (U.S. Pat. No. 5,951,786) discloses a solar cell module including an insulating base material, an electrically conductive wiring patterned on a surface of the insulating base material, and a back electrode type solar cell overlying the wiring and electrically connected thereto.

CITATION LIST

Patent Literature

PTL 1: U.S. Pat. No. 5,951,786

SUMMARY OF INVENTION

Technical Problem

The solar cell module of the configuration described in Patent Literature 1 can be fabricated for example as follows:

Initially, a meshed insulating base material formed for example of a polymeric material is prepared and on a surface thereof a patterned wiring is formed.

Subsequently, the electrodes of back electrode type solar cells are bonded with an electrically conductive adhesive to the wiring patterned on the surface of the meshed insulating base material. The back electrode type solar cells are thus electrically connected to the wiring on the surface of the meshed insulating base material.

The back electrode type solar cells electrically connected to the wiring on the surface of the meshed insulating base material are pressed to a sealing material disposed between a glass substrate and the back electrode type solar cells and between a back surface protection sheet and the back electrode type solar cells and are heated. The back electrode type solar cells are thus sealed in the sealing material. A solar cell module is thus fabricated.

Herein, the sealing material will be introduced through the mesh of the meshed insulating base material into between the back electrode type solar cells and the wiring and thus cure to seal the back electrode type solar cells between the glass substrate and the back surface protection sheet (see Patent Literature 1, column 7, lines 13-28).

In the solar cell module described in Patent Literature 1, a problem will occur in reliability if there is a space between a back electrode type solar cell and the insulating base material, and accordingly, the insulating base material is meshed and the sealing material in the form of a sheet is disposed adjacent to the insulating base material, and pressed and thus heated to introduce space between the back electrode type solar cell and the insulating base material.

However, the solar cell module described in Patent Literature 1 occasionally had air voids or similar gaseous voids remaining in the sealing material between a back electrode type solar cell and the insulating base material.

If the solar cell module has gaseous voids remaining in the sealing material between a back electrode type solar cell and the insulating base material, the back electrode type solar cell and the insulating base material cannot be bonded together with sufficient strength, and an electrode associated with the back electrode type solar cell and a wiring associated with the insulating base material are connected unsatisfactorily.

In particular, when the solar cell module is in use, the solar cell module is in an environment exposing it to high temperature, and accordingly, the gaseous voids remaining in the sealing material between the back electrode type solar cell and the insulating base material thermally expand, which causes a stress in a direction to tear apart the wiring on the insulating base material and the electrode of the back electrode type solar cell, and the electrode associated with the back electrode type solar cell and the wiring associated with the insulating base material are thus connected unsatisfactorily.

Gaseous voids remaining in the sealing material between the back electrode type solar cell and the insulating base material help water vapor to enter the sealing material, and hence help metal ions to migrate from the wiring and/or the electrode, and thus provide an increased possibility of electrical short circuit.

Note that while Patent Literature 1 describes a solar cell module considered only in a configuration in which a back electrode type solar cell has opposite ends each with only a single electrode, a back electrode type solar cell with more electrodes and accordingly more wirings corresponding thereto has the electrodes with a smaller space therebetween and the wirings with a smaller space therebetween, and the solar cell module thus has an increased tendency to have poor reliability.

In view of the above-mentioned circumstance, the present invention contemplates an interconnection sheet, a solar cell with the interconnection sheet, a solar cell module, and an interconnection sheet roll that can enhance the solar cell module in reliability.

Solution to Problem

The present invention is an interconnection sheet for connecting a back electrode type solar cell having a semiconductor substrate and an electrode for n type and an electrode for p type disposed at one surface of the semiconductor substrate, including: an insulating base material; and a wiring provided on a surface of the insulating base material, the wiring having a plurality of strip-shaped wires for n type each for connecting an electrode for n type of the back electrode type solar cell, a plurality of strip-shaped wires for p type each for connecting an electrode for p type of the back electrode type solar cell, a first connecting wire electrically connected to one end of each of the wires for n type, and a second connecting wire electrically connected to one end of each of the wires for p type, the wire for n type and the wire for p type extending in a first direction, the first connecting wire and the second connecting wire extending in a second direction different from the first direction, the wire for n type and the wire for p type being mutually spaced and disposed in the second direction to configure an alternating array portion, a maximum linear distance X in the first direction from a connection portion connecting the wire for n type and the first connecting wire to a connection portion connecting the wire for p type and the second connecting wire, a maximum length Y of the alternating array portion in the first direction, and a maximum length Z of the alternating array portion in the second direction satisfying a relationship of $Y \leq Z < X$.

Furthermore, the present invention is a solar cell with an interconnection sheet, including: the above interconnection sheet; and a back electrode type solar cell having a semiconductor substrate and an electrode for n type and an electrode for p type disposed at one surface of the semiconductor substrate, the wire for n type of the interconnection sheet and the electrode for n type of the back electrode type solar cell having the wire for n type and the electrode for n type are electrically connected to each other, the wire for p type of the interconnection sheet and the electrode for p type of the back electrode type solar cell having the wire for p type and the electrode for p type are electrically connected to each other. Furthermore, the present invention is a solar cell module including the solar cell with the interconnection sheet as described above.

Furthermore, the present invention is an interconnection sheet roll including the above interconnection sheet that is rolled.

Furthermore, the present invention is a solar cell with an interconnection sheet, including: a back electrode type solar cell having a semiconductor substrate and an electrode for n type and an electrode for p type disposed at one surface of the semiconductor substrate; and an interconnection sheet having an insulating base material and a wiring disposed at one surface of the insulating base material, the wiring having a plurality of strip-shaped wires for n type each for connecting the electrode for n type of the back electrode type solar cell, a plurality of strip-shaped wires for p type each for connecting the electrode for p type of the back electrode type solar cell, a first connecting wire electrically connected to one end of each of the electrodes for n type, and a second connecting wire electrically connected to one end of each of the wires for p type, the wire for n type and the wire for p type extending in a first direction, the first connecting wire and the second connecting wire extending in a second direction different from the first direction, the wire for n type and the wire for p type being mutually spaced and disposed in the second direction to configure an alternating array portion, a gap being provided in at least one of a region between an end of the wire for n type at the opposite side of the first connecting wire and the second connecting wire and a region between an end of the wire for p type at the opposite side of the second connecting wire and the first connecting wire, the wire for n type of the interconnection sheet and the electrode for n type of the back electrode type solar cell are electrically connected to each other, the wire for p type of the interconnection sheet and the electrode for p type of the back electrode type solar cell are electrically connected to each other, the gap having at least a portion exposed from a perimeter of the back electrode type solar cell.

Furthermore, the present invention is a solar cell module including the solar cell with the interconnection sheet as described above.

Advantageous Effects of Invention

The present invention can provide an interconnection sheet, a solar cell with the interconnection sheet, a solar cell module, and an interconnection sheet roll that can enhance the solar cell module in reliability.

BRIEF DESCRIPTION OF DRAWINGS

FIG. 9 is a schematic cross section taken along a line IX-IX in FIG. 8.

FIGS. 10(a) and 10(b) are schematic cross sections for illustrating an example of a method for fabricating the solar cell with the interconnection sheet configured as shown in FIGS. 8 and 9.

FIGS. 13(a) and 13(b) are schematic cross sections for illustrating one example of the method for fabricating a solar cell module in accordance with the present invention.

FIGS. 14(a) and 14(b) are schematic cross sections for illustrating another example of the method for fabricating the solar cell module in accordance with the present invention.

DESCRIPTION OF EMBODIMENTS

Figure 1:
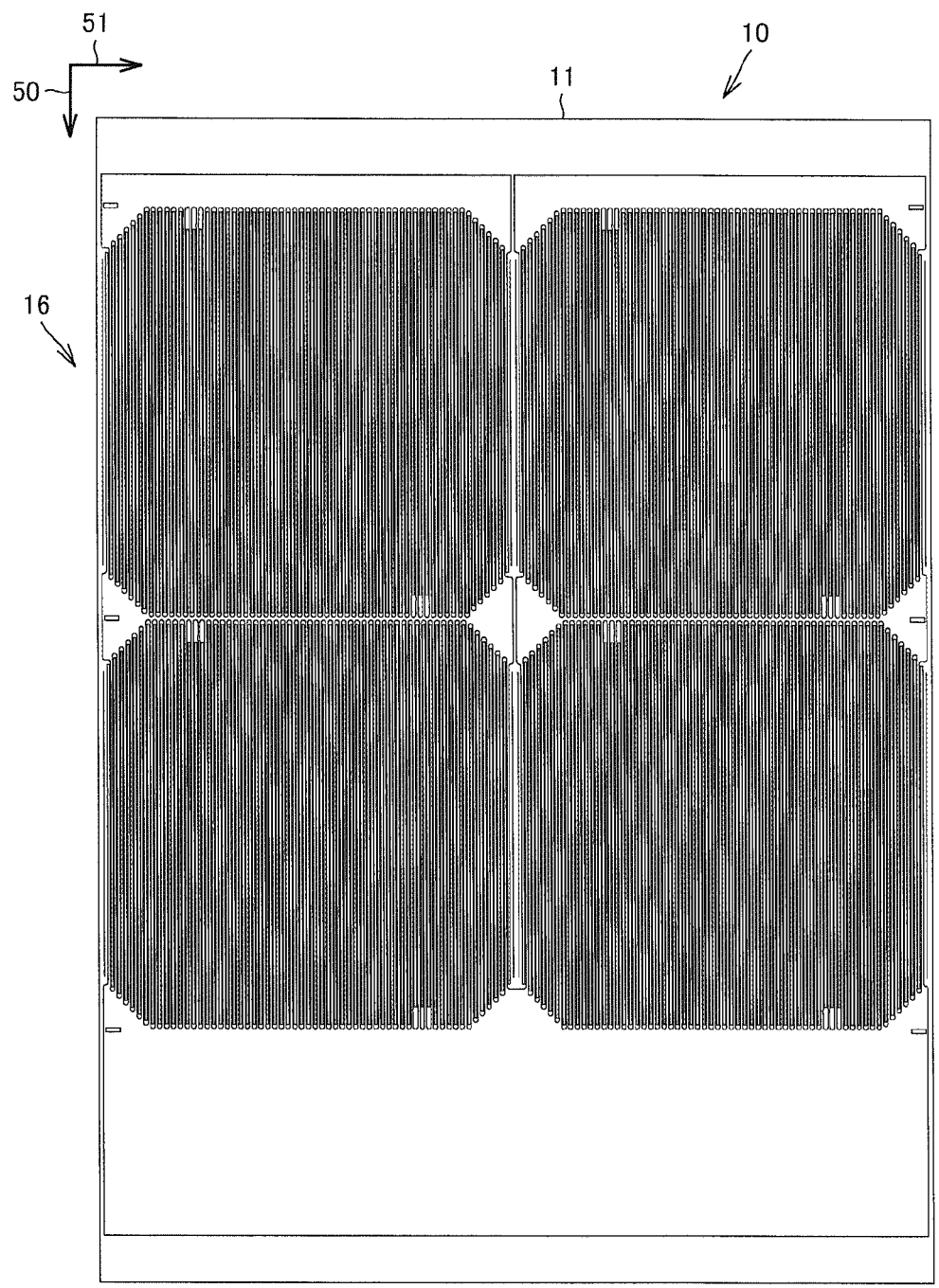
FIG. 1 is a schematic plan view of one example of an interconnection sheet in accordance with the present invention, as seen at a side thereof provided with wiring.

Hereinafter, the present invention will be described in embodiments. In the figures, identical reference characters denote identical or corresponding components.

Interconnection Sheet

FIG. 1 is a schematic plan view of one example of an interconnection sheet in accordance with the present invention, as seen at a side thereof provided with wiring. As shown in FIG. 1, an interconnection sheet 10 has an insulating base material 11 and a wiring 16 provided on a surface of insulating base material 11.

Note that while in the present specification an example will be described with a first direction 50 and a second direction 51 forming 90°, the present invention only requires first direction 50 and second direction 51 to be different directions, respectively, and first direction 50 and second direction 51 may form an angle for example within a range of 90°±14°. Furthermore, in the present specification, first direction 50 and second direction 51 each include any directions identical and opposite to those shown in the figures and both, and can be used as appropriate depending on the situation.

Figure 2:
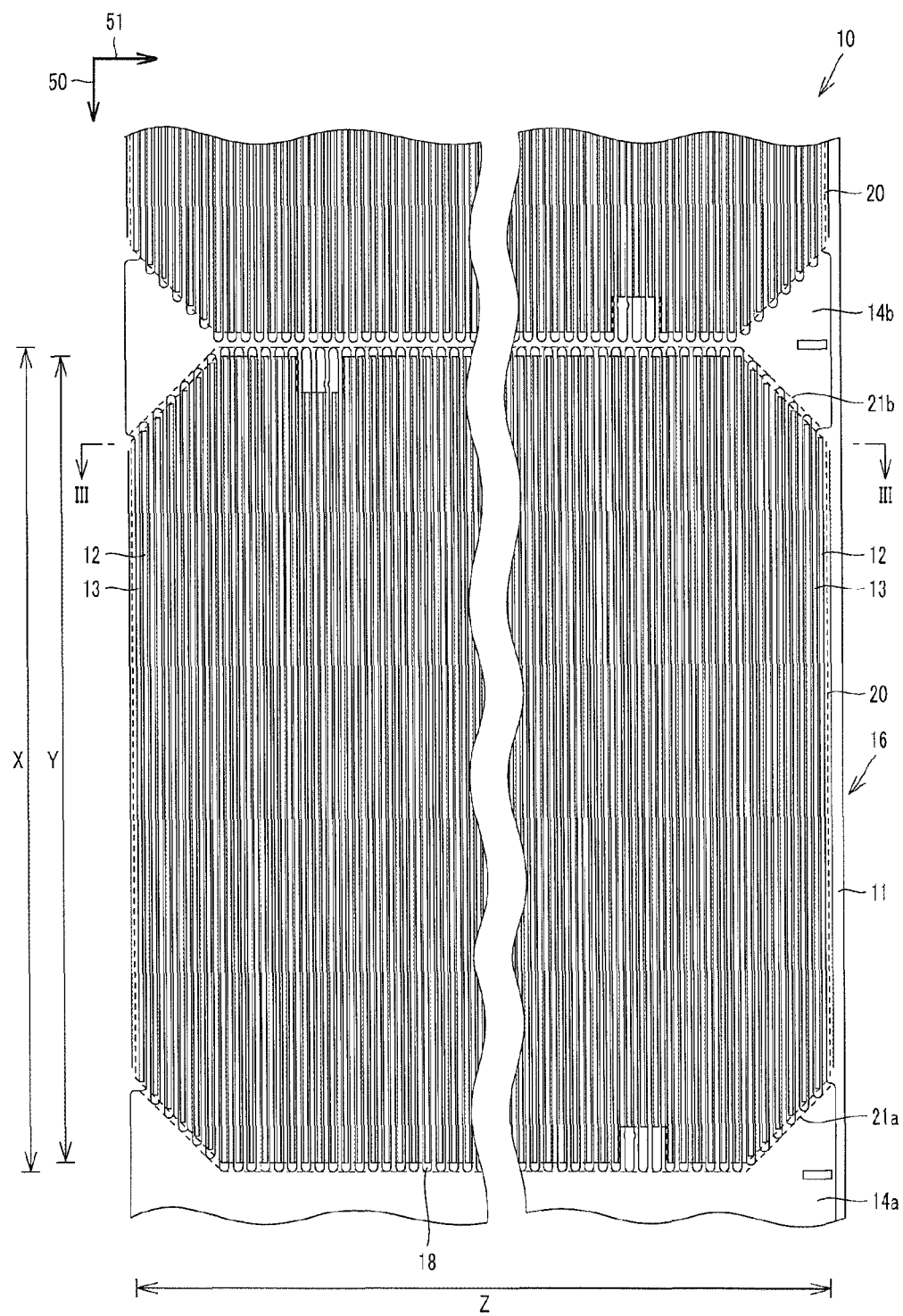
FIG. 2 is a schematic enlarged plan view of the interconnection sheet shown in FIG. 1.

FIG. 2 is a schematic enlarged plan view of the interconnection sheet shown in FIG. 1. As shown in FIG. 2(*a*), wiring 16 of interconnection sheet 10 includes a wire for n type 12, a wire for p type 13, first connecting wire 14*a* and second connecting wire 14*b*, disposed on a surface of insulating base material 11.

Note that wire for n type 12, wire for p type 13, first connecting wire 14*a* and second connecting wire 14*b* are all electrically conductive, and wire for n type 12 and wire for p type 13 are each provided in the form of a strip extending in first direction 50 and first connecting wire 14*a* and second connecting wire 14*b* are each provided in a form extending in second direction 51.

A plurality of wires for n type 12 each have one end electrically connected to first connecting wire 14*a*, and a plurality of wires for p type 13 each have one end electrically connected to second connecting wire 14*b*.

A single first connecting wire 14*a* and the plurality of strip-shaped wires for n type 12 electrically connected thereto configure a single comb-like wiring for n type, and a single second connecting wire 14*b* and the plurality of strip-shaped wires for p type 13 electrically connected thereto configure a single comb-like wiring for p type.

Herein, the single comb-like wiring for p type and the single comb-like wiring for n type are provided to have their respective teeth facing each other, and strip-shaped wires for n type 12 corresponding to the teeth of the comb-like wiring for n type and strip-shaped wires for p type 13 corresponding to the teeth of the comb-like wiring for p type are disposed in second direction 51 one by one alternately with a distance therebetween to configure an alternating array portion 20. Note that alternating array portion 20 is a wiring area where wires for n type 12 and wires for p type 13 are disposed one by one alternately.

Figure 3:
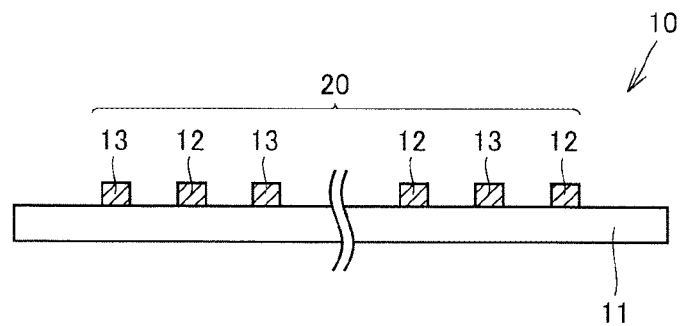
FIG. 3 is a schematic cross section taken along a line III-III shown in FIG. 2.

FIG. 3 is a schematic cross section taken along a line III-III shown in FIG. 2. As shown in FIG. 3, interconnection sheet 10 has wire for n type 12 and wire for p type 13 only on one surface of insulating base material 11, and wire for n type 12 and wire for p type 13 are disposed alternately one by one with a predetermined distance therebetween to configure alternating array portion 20.

Furthermore, as shown in FIG. 2, in a single alternating array portion 20 a gap 18 is provided between an end of wire for n type 12 on the opposite side of first connecting wire 14*a* and second connecting wire 14*b* and between an end of wire for p type 13 at the opposite side of second connecting wire 14*b* and first connecting wire 14*a*. Note that gap 18 is a region of interconnection sheet 10 on a surface of insulating base material 11 which does not have wiring.

Furthermore, in FIG. 2, one end of second connecting wire 14*b* in first direction 50 is electrically connected to one end of each of the plurality of wires for p type 13 and the other end of second connecting wire 14*b* in first direction 50 is electrically connected to one end of each at the plurality of wires for n type 12, and alternating array portions 20 disposed adjacently in first direction 50 are thus electrically connected by second connecting wire 14*b*.

Note that interconnection sheet 10 shown in FIG. 1 has an upper left alternating array portion and a lower left alternating array portion electrically connected together, the lower left alternating array portion and a lower right alternating array portion electrically connected together, and the lower right alternating array portion and an upper right alternating array portion electrically connected together. Thus, interconnection sheet 10 shown in FIG. 1 has alternating array portions electrically connected in the form of the letter U.

Herein, in a single alternating array portion 20, when X represents a maximum linear distance in first direction 50 from a connection portion 21*a* connecting first connecting wire 14*a* and wire for n type 12 to a connection portion 21*b* connecting second connecting wire 14*b* and wire for p type 13, Y represents a maximum length of alternating array portion 20 in first direction 50, and Z represents a maximum length of alternating array portion 20 in second direction 51, then, X, Y, and Z satisfy a relationship represented by the following expression (1):

$$Y \leq Z < X \quad (1).$$

When interconnection sheet 10 having X, Y, and Z satisfying expression (1) is used to fabricate a solar cell with an interconnection sheet and a solar cell module, the solar cell with the interconnection sheet and the solar cell module allow their internal air or similar gas to be discharged through gap 18 and can thus reduce gaseous voids remaining therein and thus prevent a problem otherwise attributed thereto, and the solar cell module can be enhanced in reliability.

Preferably, a difference between Y and Z is 1 mm or smaller, and a difference between X and Z is 0.4 mm or larger. This allows interconnection sheet 10 to have gap 18 having an appropriate size, while allowing electric power to be collected from a below-described back electrode type solar cell efficiently.

Figure 17:
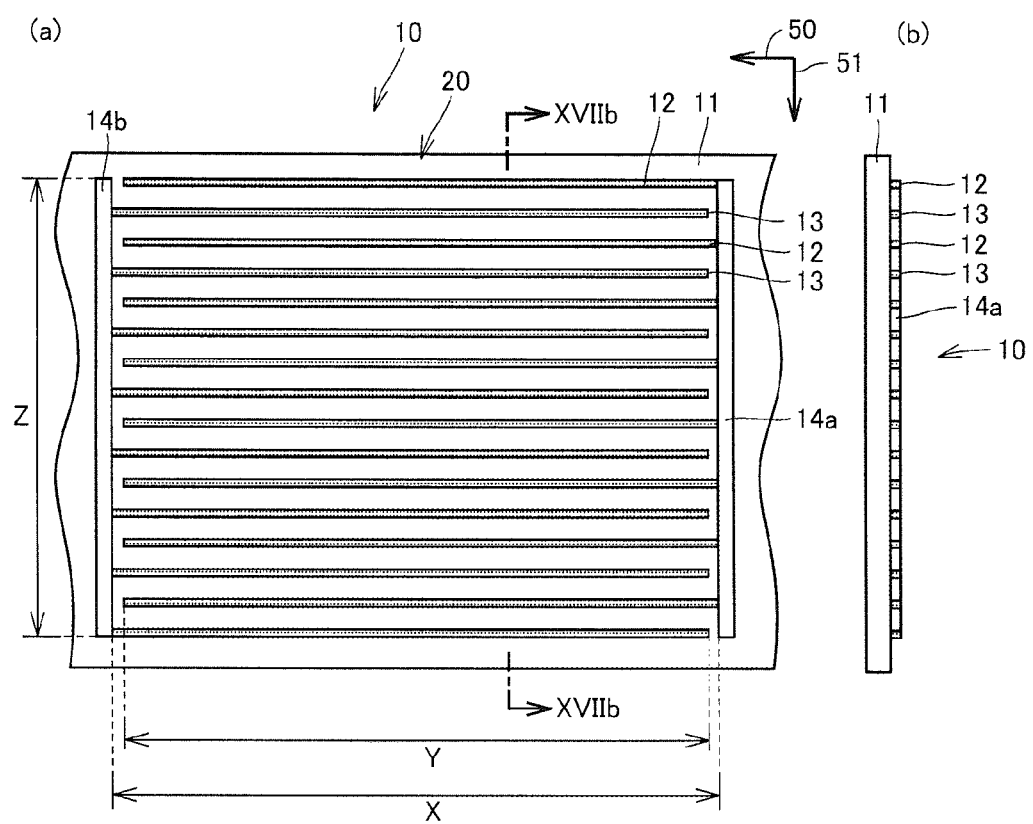
FIG. 17(*a*) is a schematic plan view of one example of an interconnection sheet in accordance with the present invention, as seen at a side thereof provided with wiring, and FIG. 17(*b*) is a schematic cross section taken along a line XVIIb-XVIIb shown in FIG. 17(*a*).

FIG. 17(*a*) is a schematic plan view of one example of an interconnection sheet in accordance with the present invention, as seen at a side thereof provided with wiring, and FIG. 17(*b*) is a schematic cross section taken along a line XVIIb-XVIIb shown in FIG. 17(*a*).

This example also provides wire for n type 12 and wire for p type 13 each in the form of a strip extending in first direction 50 and first connecting wire 14*a* and second connecting wire 14*b* each in a form extending in second direction 51. A plurality of wires for n type 12 each have one end electrically connected to first connecting wire 14*a*, and a plurality of wires for p type 13 each have one end electrically connected to second connecting wire 14*b*.

A single first connecting wire 14a and the plurality of strip-shaped wires for n type 12 electrically connected thereto configure a single comb-like wiring for n type, and a single second connecting wire 14b and the plurality of strip-shaped wires for p type 13 electrically connected thereto configure a single comb-like wiring for p type.

Herein, the single comb-like wiring for n type and the single comb-like wiring for p type are provided to have their respective teeth facing each other, and strip-shaped wires for n type 12 corresponding to the teeth of the comb-like wiring for n type and strip-shaped wires for p type 13 corresponding to the teeth of the comb-like wiring for p type are disposed in second direction 51 one by one alternately with a distance therebetween to configure alternating array portion 20.

Note that the strip-shaped wire for n type 12 and/or the strip-shaped wire for p type 13 may have a surface having at least a portion in the form of a triangle and/or a trapezoid.

Furthermore in the present invention the concept of "a wire for n type and a wire for p type alternately disposed" includes not only a concept that the wire for n type and the wire for p type are alternately disposed one by one but also a concept that between adjacent wires for n type a plurality of wires for p type are disposed and a concept that between adjacent wires for p type a plurality of wires for n type are disposed.

Note that in the above description, insulating base material 11 may be formed of any material that is electrically insulating, and it may be formed for example of a material including at least one type of resin selected from the group consisting of polyethylene terephthalate (PET), polyethylene naphthalate (PEN), polyphenylene sulfide (PPS), polyvinyl fluoride (PVF), and polyimide.

Furthermore, insulating base material 11 may not be limited to any particular value in thickness, and may range for example from 25 μm to 150 μm.

Note that insulating base material 11 may be formed of a single layer, i.e., have a monolayer structure, or may be formed of two or more layers, i.e., have a multilayer structure.

Furthermore, wiring 16 may be formed of any material that is electrically conductive, e.g., metal including at least one type selected from the group consisting of copper, aluminum and silver.

Furthermore, wiring 16 is also not limited in thickness, and may range for example from 10 μm to 50 μm.

Furthermore, wiring 16 may have a surface having at least a portion provided for example with an electrically conductive substance including at least one type selected from the group consisting of nickel (Ni), gold (Au), platinum (Pt), palladium (Pd), silver (Ag), tin (Sn), SnPb solder, and indium tin oxide (ITO). This provides a tendency that electrical connection between wiring 16 of interconnection sheet 10 and an electrode of a back electrode type solar cell described later can be excellent and weather resistance of wiring 16 can be improved.

Furthermore, wiring 16 may have a surface having at least a portion subjected to rust-proofing, blacking processing, or similar surface processing.

Note that wiring 16 may also be formed of a single layer, i.e., have a monolayer structure, or may be formed of two or more layers, i.e., have a multilayer structure.

Hereinafter will be described one example of a method of fabricating interconnection sheet 10 in the above configuration. Initially, insulating base material 11 for example of PEN film is prepared and an electrically conductive substance for example in the form of metal foil, metal plate or the like is affixed on across one surface of insulating base material 11. This can be done for example by pulling out a roll of the insulating base material cut to have a predetermined width, applying an adhesive to one surface of the insulating base material, disposing thereon a roll of metallic foil cut to be slightly smaller than the width of the insulating base material, and pressurizing and heating them to bond them together.

Subsequently, the electrically conductive substance affixed on one surface of insulating base material 11 is partially, photolithographically or similarly etched away and thus patterned to provide wiring 16 including wire for n type 12, wire for p type 13, first connecting wire 14a and second connecting wire 14b and the like formed of the patterned electrically conductive substance on the surface of insulating base material 11. Interconnection sheet 10 configured as described above can thus be produced.

Interconnection Sheet Roll

Figure 4:
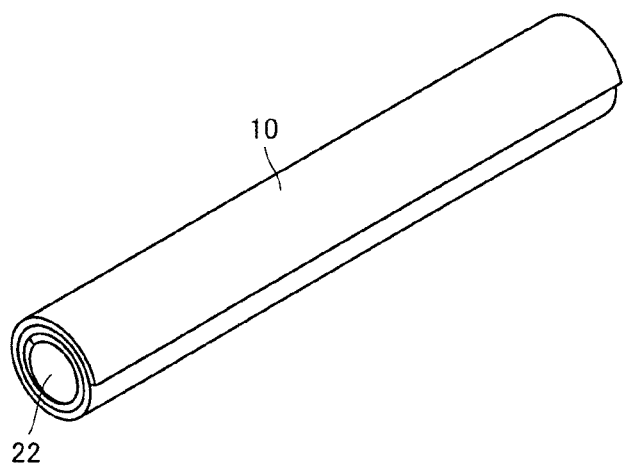
FIG. 4 is a schematic perspective view of one example of an interconnection sheet roll in accordance with the present invention.

FIG. 4 is a schematic perspective view of one example of an interconnection sheet roll in accordance with the present invention. The interconnection sheet roll is formed as follows: For example, wiring 16 of the form shown in FIG. 1 is successively formed on a surface of insulating base material 11 to form an elongate interconnection sheet 10 which is in turn rolled on a core 22. Note that core 22 may be any core that allows interconnection sheet 10 to be rolled thereon.

Figure 5:
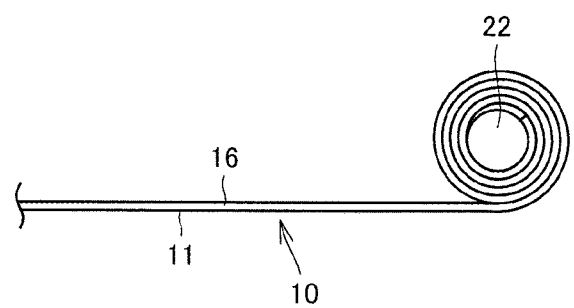
FIG. 5 is a schematic side view for illustrating one example of how the present interconnection sheet roll is used.

Interconnection sheet 10 thus rolled to be an interconnection sheet roll can be unrolled from and cut off the interconnection sheet roll to have different lengths, as required, as shown in the schematic side view of FIG. 5, and thus used, and the same single interconnection sheet roll can thus be used to fabricate solar cells with a interconnection sheet and solar cell modules of various sizes.

For example, if interconnection sheet 10 shown for example in FIG. 1 unrolled from the interconnection sheet roll in first direction 50 is cut in second direction 51 across alternating array portion 20 and thus has opposite ends configured of alternating array portions 20 cut across, then, for example, attaching a single strip-shaped conductive member to one end of cut-out interconnection sheet 10 at two cut-across alternating array portions 20 such that the conductive member has its longitudinal direction matched to second direction 51 allows the cut-out interconnection sheet to be used as interconnection sheet 10. This can electrically connect wires for n type 12 or wires for p type 13 of two alternating array portions 20 located at one end of the cut-out interconnection sheet 10 that are aligned in second direction 51, and hence electrically connect these two alternating array portions 20 adjacent in second direction 51 to allow interconnection sheet 10 to have alternating array portions 20 electrically connected in the form of the letter U.

Back Electrode Type Solar Cell

Figure 6:
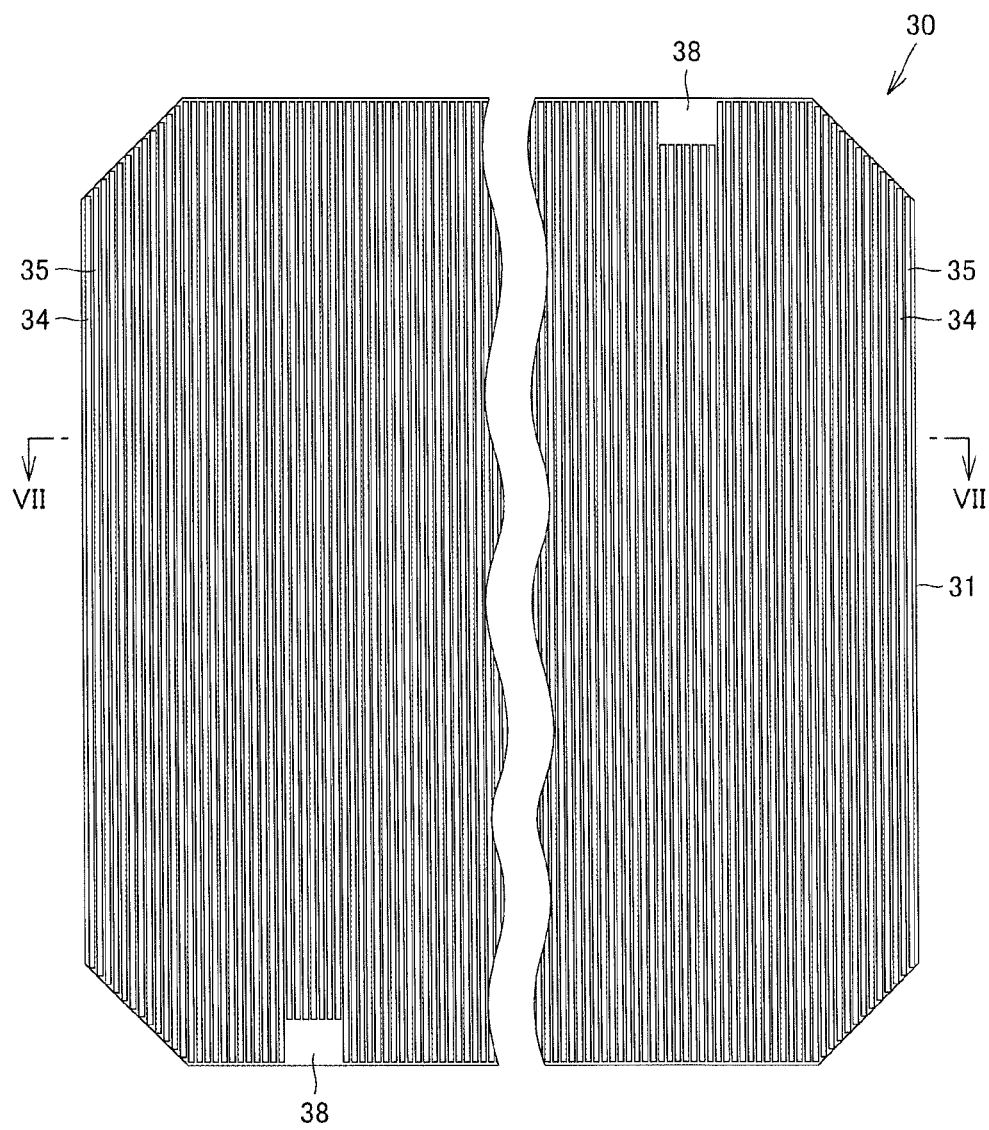
FIG. 6 is a schematic plan view of one example of a back surface of a back electrode type solar cell used in the present invention.

FIG. 6 is a schematic plan view of one example of a back surface of a back electrode type solar cell used in the present invention. Herein, back electrode type solar cell 30 has an electrode for n type 34 and an electrode for p type 35 each in the form of a strip, and strip-shaped electrode for n type 34 and strip-shaped electrode for p type 35 are disposed on a back surface of a semiconductor substrate 31 one by one alternately with a predetermined distance therebetween.

Furthermore, back electrode type solar cell 30 has a perimeter partially provided with an electrode-absent portion 38 that does not have electrode for n type 34 and electrode for p type 35, and electrode-absent portion 38 can for example provide an alignment mark for providing back electrode type solar cell 30 on interconnection sheet 10 at a position precisely.

Note that electrode for n type 34 and electrode for p type 35 on the back surface of back electrode type solar cell 30 are not limited geometrically or positionally to the configuration shown in FIG. 6, as long as they are electrically connectable to wire for n type 12 and wire for p type 13 of interconnection sheet 10.

Furthermore, on at least a portion of a surface of electrode for n type 34 and/or at least a portion of a surface of electrode for p type 35 of back electrode type solar cell 30, for example, an electrically conductive substance including at least one type selected from the group consisting of nickel (Ni), gold (Au), platinum (Pt), palladium (Pd), silver (Ag), copper (Cu), tin (Sn), titanium (Ti), SnPb solder, SnBi solder, and indium tin oxide (ITO) may be provided. This provides a tendency that electrical connection between wiring 16 (wire for n type 12 and wire for p type 13) of interconnection sheet 10 and an electrode (electrode for n type 34 and electrode for p type 35) of back electrode type solar cell 30 can be excellent and weather resistance of the electrode of back electrode type solar cell 30 can be improved.

Furthermore, back electrode type solar cell 30 may have electrode for n type 34 and/or electrode for p type 35 with at least a portion thereof having a surface subjected for example to rust-proofing or similar surface processing.

Figure 7:
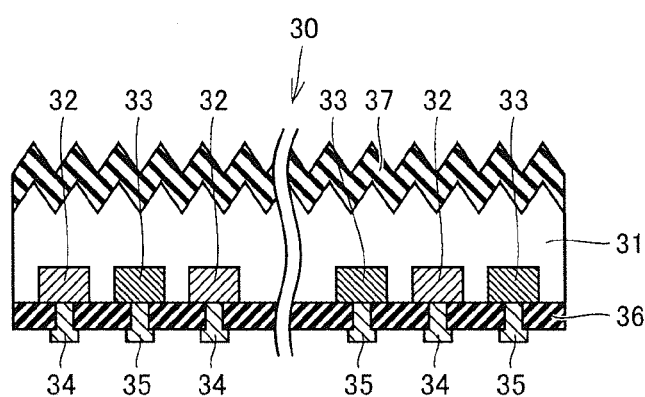
FIG. 7 is a schematic cross section taken along a line VII-VII shown in FIG. 6.

FIG. 7 is a schematic cross section taken along a line VII-VII shown in FIG. 6. Herein, back electrode type solar cell 30 for example has an n or p type silicon or similar semiconductor substrate 31, an anti-reflection film 37 provided on an uneven surface of semiconductor substrate 31 serving as a photoreceptive surface of back electrode type solar cell 30, and a passivation film 36 provided on a back surface of semiconductor substrate 31 serving as a back surface of back electrode type solar cell 30.

Furthermore, semiconductor substrate 31 at the back surface side has for example phosphorus or a similar n type impurity and boron or a similar p type impurity diffused therein to have an n type impurity diffusion region 32 and a p type impurity diffusion region 33, respectively, alternately with a predetermined distance therebetween, and is also provided with electrode for n type 34 and electrode for p type 35 in contact with n type impurity diffusion region 32 and p type impurity diffusion region 33, respectively, via a contact hole provided through passivation film 36 provided on the back surface side of semiconductor substrate 31.

Furthermore, semiconductor substrate 31 of n or p type conduction will have a back surface side having a plurality of pn junctions formed at an interface of n type impurity diffusion region 32 or p type impurity diffusion region 33 and an internal portion of semiconductor substrate 31. Whichever of n type conduction or p type conduction semiconductor substrate 31 may be of, n type impurity diffusion region 32 and p type impurity diffusion region 33 have junction with an internal portion of semiconductor substrate 31 and accordingly electrode for n type 34 and electrode for p type 35 will serve as electrodes corresponding respectively to the plurality of pn junctions provided closer to the back surface side of semiconductor substrate 31.

Figure 15:
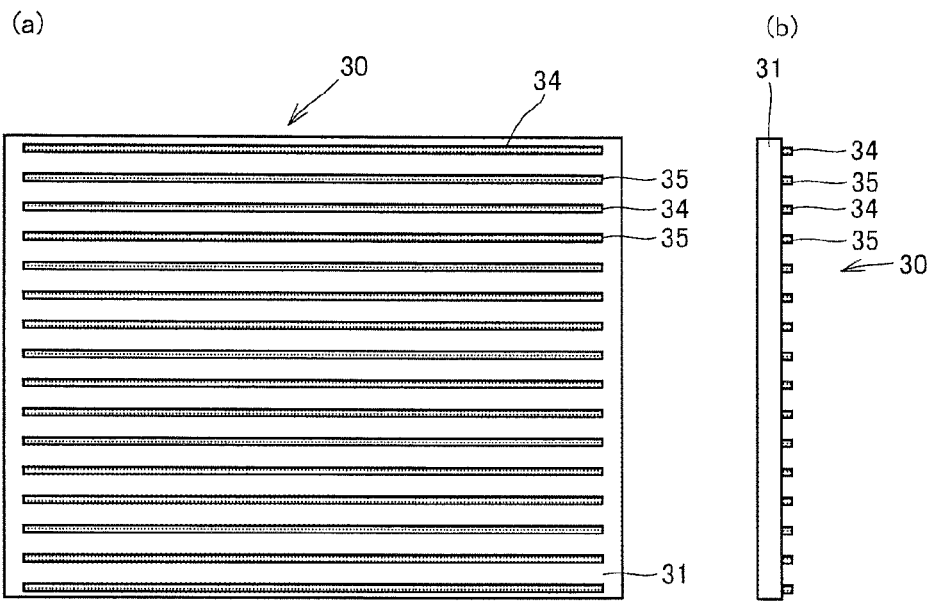
FIG. 15(a) is a schematic plan view of another example of the back surface of the back electrode type solar cell used in the present invention.
FIG. 15(b) is a schematic side view of the back electrode type solar cell shown in FIG. 15(a).

FIG. 15(a) is a schematic plan view of another example of the back surface of the back electrode type solar cell used in the present invention, and FIG. 15(b) is a schematic side view of the back electrode type solar cell shown in FIG. 15(a).

This example also provides electrode for n type 34 and electrode for p type 35 provided each in the form of a strip and disposed on semiconductor substrate 31 one by one alternately with a predetermined distance therebetween.

Note that strip-shaped electrode for n type 34 and/or strip-shaped electrode for p type 35 may have a surface having at least a portion in the form of a triangle and/or a trapezoid.

Furthermore in the present invention the concept of "an electrode for n type and an electrode for p type alternately disposed" includes not only a concept that the electrode for n type and the electrode for p type are alternately disposed one by one but also a concept that between adjacent electrodes for n type a plurality of electrodes for p type are disposed and a concept that between adjacent electrodes for p type a plurality of electrodes for n type are disposed.

Figure 16:
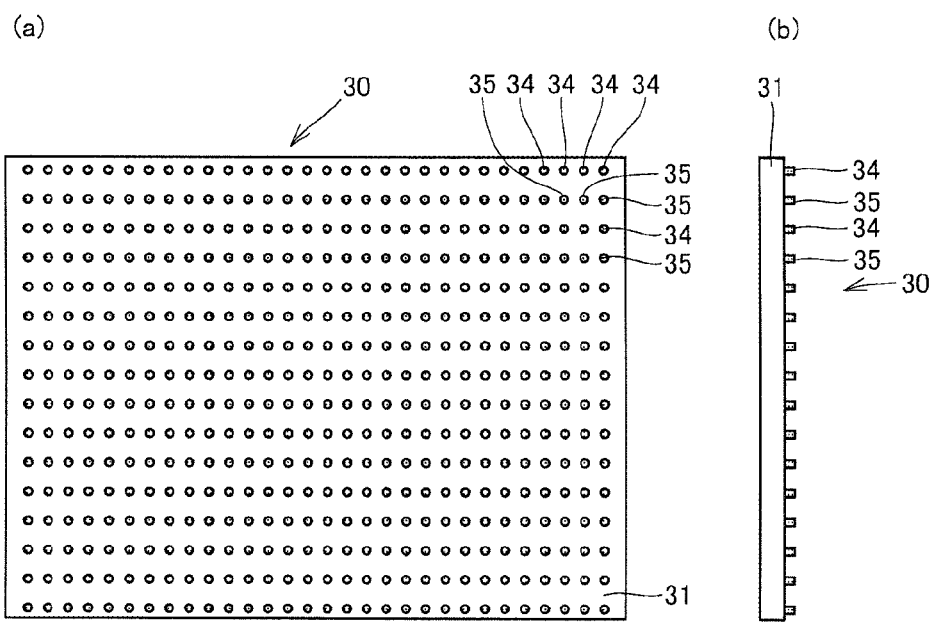
FIG. 16(a) is a schematic plan view of another example of the back surface of the back electrode type solar cell used in the present invention.
FIG. 16(b) is a schematic side view of the back electrode type solar cell shown in FIG. 16(a).

FIG. 16(a) is a schematic plan view of another example of the back surface of the back electrode type solar cell used in the present invention, and FIG. 16(b) is a schematic side view of the back electrode type solar cell shown in FIG. 16(a).

In this example, electrode for n type 34 and electrode for p type 35 are formed in dots, respectively, and a plurality of dot electrodes for n type 34 and a plurality of dot electrodes for p type 35 is each disposed linearly. The plurality of dot electrodes for n type 34 and the plurality of dot electrodes for p type 35 form rows, respectively, and the rows are disposed alternately one by one with a distance therebetween.

Note that the concept of being linearly disposed only requires being disposed to proceed at least in a direction, and it includes not only a case with an electrode for n type and/or an electrode for p type disposed exactly in a line(s) but also a case with at least a portion thereof disposed in a zigzag. Furthermore, the distances between the electrodes for n type in a row of a plurality of electrodes for n type and/or the distances between the electrodes for p type in a row of a plurality of electrodes for p type may not be equal.

Furthermore, the concept of "a plurality of electrodes for n type and a plurality of electrodes for p type forming rows, respectively, alternately disposed" includes not only a concept that a row of the plurality of electrodes for n type and a row of the plurality of electrodes for p type, respectively, are alternately disposed one by one but also a concept that between adjacent rows of electrodes for n type a plurality of rows of electrodes for p type are disposed and a concept that between adjacent rows of electrodes for p type a plurality of rows of electrodes for n type are disposed.

As semiconductor substrate 31, a silicon substrate formed of an n or p type polycrystal or monocrystal and the like can be implemented for example. Note that preferably, semiconductor substrate 31 is monocrystalline for forming a pn junction at the back surface side.

Electrode for n type 34 and electrode for p type 35 can be implemented for example as electrodes formed of metal such as silver.

As passivation film 36, for example, a silicon oxide film, a silicon nitride film, or a silicon oxide film and a silicon nitride film stacked in layers, or the like can be implemented.

As anti-reflection film 37, for example, a silicon nitride film can be implemented.

Note that the concept of the present back electrode type solar cell includes not only a back electrode type solar cell having semiconductor substrate 31 with only one surface (a back surface) having both electrode for n type 34 and electrode for p type 35, but also all of a metal wrap through (MWT) cell (i.e., a solar cell having a semiconductor substrate having a through hole with a portion of an electrode therein) and similar, so called back contact type solar cells (i.e., solar cells having a structure extracting an electric current from the cell's back surface opposite to its photoreceptive surface).

Solar Cell with Interconnection Sheet

Figure 8:
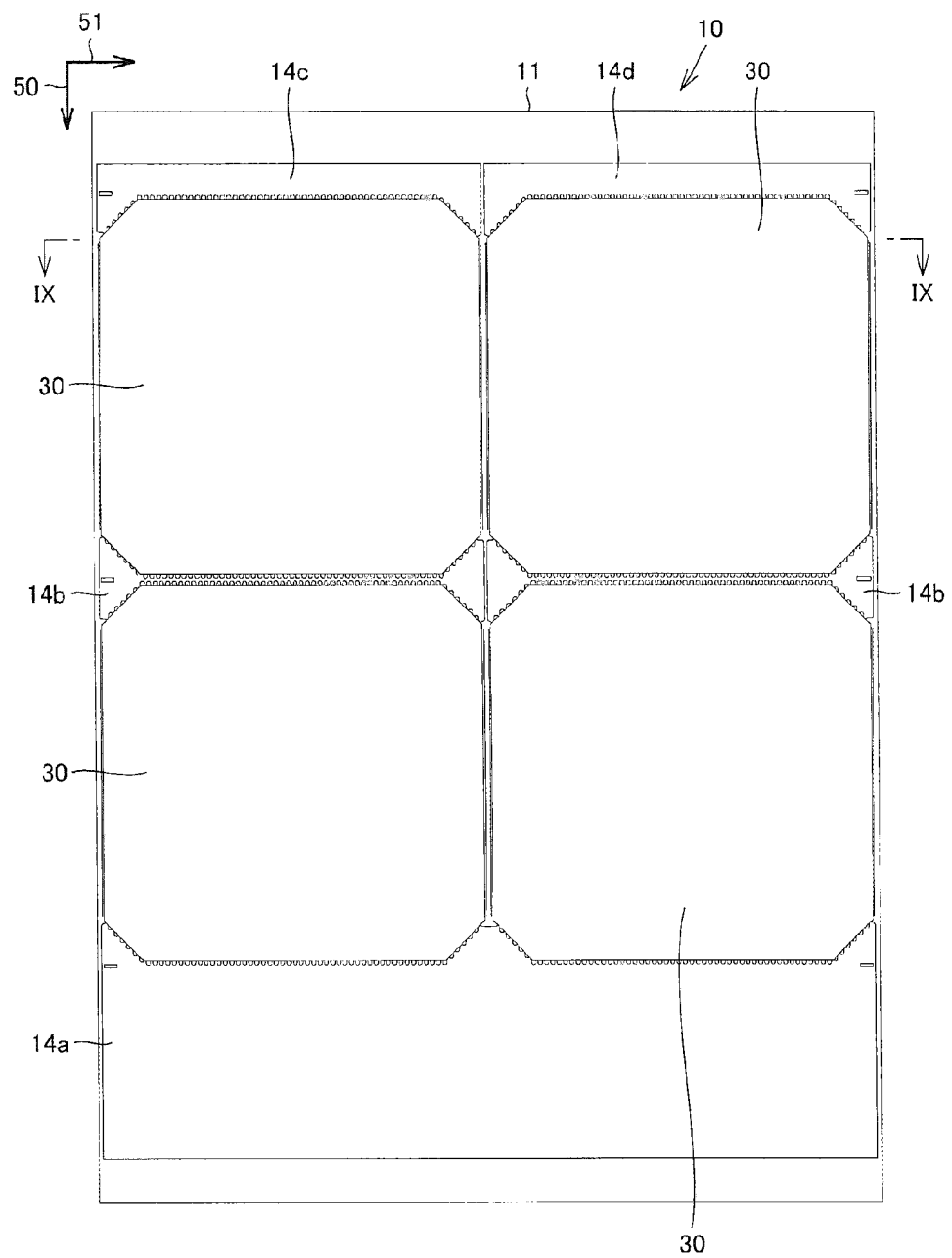
FIG. 8 is a schematic plan view of one example of a solar cell with an interconnection sheet in accordance with the present invention, as seen at its photoreceptive surface.

FIG. 8 is a schematic plan view of one example of a solar cell with an interconnection sheet in accordance with the present invention, as seen at its photoreceptive surface, and FIG. 9 is a schematic cross section taken along a line IX-IX shown in FIG. 8.

Note that hereinafter a solar cell with an interconnection sheet of the present invention will be described by way of example in a configuration in which a plurality of back electrode type solar cells 30 shown in FIG. 6 and FIG. 7 are connected on wiring 16 of interconnection sheet 10 shown in FIG. 1 to FIG. 3, however, the solar cell with the interconnection sheet of the present invention is not limited in configuration to that shown in FIGS. 8 and 9. For example, the solar cell with the interconnection sheet of the present invention may be configured with a single interconnection sheet with a single back electrode type solar cell connected thereto.

As shown in FIG. 8 and FIG. 9, the solar cell with the interconnection sheet is fabricated with back electrode type solar cell 30 disposed on interconnection sheet 10 such that the back surface of back electrode type solar cell 30 and the side of interconnection sheet 10 that is provided with wiring 16 face each other.

More specifically, as shown in FIG. 9, electrode for n type 34 at the back surface of back electrode type solar cell 30 is electrically connected to wire for n type 12 provided on a surface of insulating base material 11 of interconnection sheet 10 via an electrically conductive adhesive 25, and electrode for p type 35 at the back surface of back electrode type solar cell 30 is electrically connected to wire for p type 13 provided on the surface of insulating base material 11 of interconnection sheet 10 via electrically conductive adhesive 25.

Note that connecting wiring 16 of interconnection sheet 10 and an electrode of back electrode type solar cell 30 only requires connecting them so that they can electrically conduct with each other, and accordingly, it is not limited to electrically connecting them via conductive adhesive 25; for example, they may directly contact each other and thus be electrically connected to each other.

Then, insulating resin 17 is provided between interconnection sheet 10 and back electrode type solar cell 30 in a region other than wiring 16 of interconnection sheet 10 and the electrodes of back electrode type solar cell 30. Insulating resin 17 thus introduced allows a solar cell with an interconnection sheet to have back electrode type solar cell 30 and interconnection sheet 10 firmly bonded together via insulating resin 17.

The solar cell with the interconnection sheet of the above configuration has interconnection sheet 10 with adjacent alternating array portions 20 electrically connected to each other, and will accordingly have adjacent back electrode type solar cells 30 on interconnection sheet 10 electrically connected in series.

That is, with reference to FIG. 8, upper left back electrode type solar cell 30 and lower left back electrode type solar cell 30 are electrically connected in series, lower left back electrode type solar cell 30 and lower right back electrode type solar cell 30 are electrically connected in series, and lower right back electrode type solar cell 30 and upper right back electrode type solar cell 30 are electrically connected in series. Thus the solar cell with the interconnection sheet shown in FIG. 8 has back electrode type solar cells 30 electrically connected in series in the form of the letter U.

Back electrode type solar cell 30 receives light at the photoreceptive surface, and thereby generates an electric current, which is in turn extracted through electrode for n type 34 and electrode for p type 35 of back electrode type solar cell 30 to wire for n type 12 and wire for p type 13 of interconnection sheet 10. Wire for n type 12 and wire for p type 13 of interconnection sheet 10 receive the electric current, which is in turn extracted externally through terminals 14c, 14d of wiring 16 of interconnection sheet 10.

Hereinafter, reference will be made to FIG. 10(a) and FIG. 10(b) showing schematic cross sections to describe an example of a method of fabricating the solar cell with the interconnection sheet of the configuration shown in FIG. 8 and FIG. 9.

Initially, as shown in FIG. 10(a), interconnection sheet 10 of the configuration shown in FIG. 1 to FIG. 3 is prepared, and a resin composition 17a containing electrically conductive adhesive 25, such as solder, and insulating resin 17 is applied to a surface of wiring 16 of interconnection sheet 10. Herein, interconnection sheet 10 can for example be interconnection sheet 10 unrolled by a desired length from the interconnection sheet roll of the above-mentioned configuration and then cut off.

Furthermore, an application method of resin composition 17a is not limited, but for example, it may be screen printing, application with a dispenser, ink jet, or application with a slit coater or the like.

Furthermore, preferably, insulating resin 17 includes any of epoxy resin, acrylic resin and a resin of a mixture of epoxy resin and acrylic resin. Note that in the present invention it is needless to say that insulating resin 17 is not limited to epoxy resin, acrylic resin and a resin of a mixture of epoxy resin and acrylic resin.

Furthermore, resin composition 17a may include one or more types of conventionally known additives, such as a curing agent, as a component other than a resin component.

Then, as shown in FIG. 10(b), back electrode type solar cell 30 is provided on interconnection sheet 10 such that electrode for n type 34 of back electrode type solar cell 30 is positioned on wire for n type 12 of interconnection sheet 10 and electrode for p type 35 of back electrode type solar cell 30 is positioned on wire for p type 13 of interconnection sheet 10.

In doing so, resin composition 17a is heated to have insulating resin 17 alone entering a region between a connection portion connecting electrode for n type 34 and wire for n type 12 and a connection portion connecting electrode for p type 35 and wire for p type 13, and thus introduced there, while having electrically conductive adhesive 25 remaining between electrode for n type 34 and wire for n type 12 and between electrode for p type 35 and wire for p type 13 and thus electrically connecting them.

The solar cell with the interconnection sheet of the configuration shown in FIG. 8 and FIG. 9 is thus fabricated.

Note that in the above description, after back electrode type solar cell 30 is provided on interconnection sheet 10, for example insulating resin 17 may be heated and/or exposed to light or the like and thus cured.

When insulating resin 17 is cured, it will itself shrink but because insulating resin 17 is bonded to passivation film 36 of back electrode type solar cell 30 and insulating base material 11 of interconnection sheet 10, it exerts shrinkage force to further firmly bond back electrode type solar cell 30 and interconnection sheet 10 together.

Figure 11:
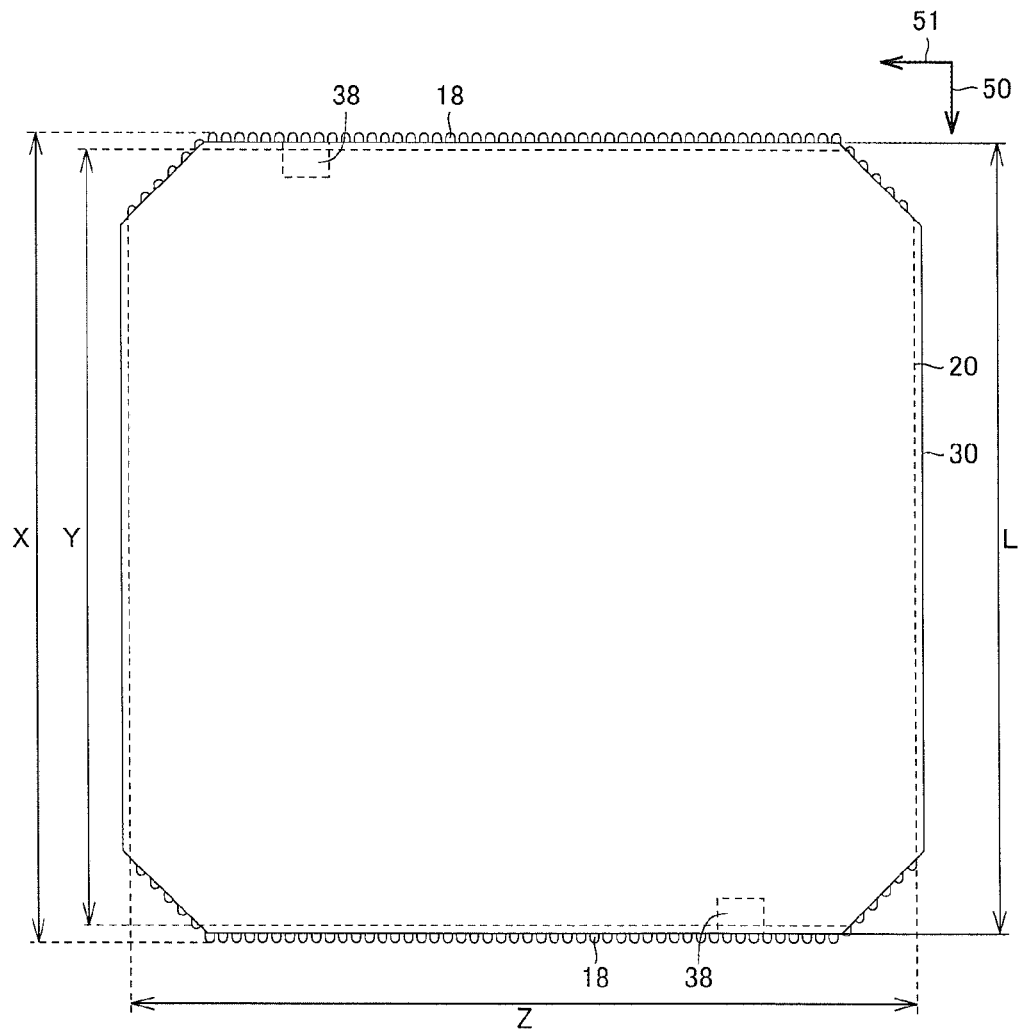
FIG. 11 is a schematic enlarged plan view of the solar cell with the interconnection sheet of the configuration shown in FIG. 8 and FIG. 9.
Figure 12:
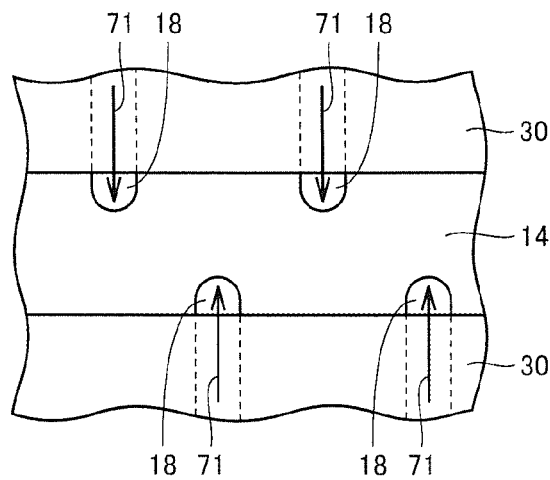
FIG. 12 is a schematic enlarged plan view for illustrating an example of how gas is discharged in fabricating the solar cell with the interconnection sheet of the configuration shown in FIG. 8 and FIG. 9.

At the time, the solar cell with the interconnection sheet of the present invention has at least a portion of gap 18 exposed externally from a perimeter of back electrode type solar cell 30 provided on interconnection sheet 10, as shown in the schematic enlarged plan view of FIG. 11, and, for example as shown in the schematic enlarged plan view of FIG. 12, when insulating resin 17 is cured, gas 71 in voids remaining in insulating resin 17 can be externally discharged through these gaps 18.

Furthermore, preferably, when back electrode type solar cell 30 is provided on interconnection sheet 10, back electrode type solar cell 30 has a maximum linear distance in the same direction as first direction 50 of interconnection sheet 10 (i.e., a length L in FIG. 11) smaller than a maximum linear distance in a single alternating array portion 20 in first direction 50 from connection portion 21a connecting first connecting wire 14a and wire for n type 12 to connection portion 21b connecting second connecting wire 14b and wire for p type 13 (i.e., a length X in FIG. 11). This provides an increased tendency that interconnection sheet 10 has a single alternating array portion 20 such that gap 18 provided between the end of wire for n type 12 at the opposite side of first connecting wire 14a and second connecting wire 14b and gap 18 provided between the end of wire for p type 13 at the opposite side of second connecting wire 14b and first connecting wire 14a can both have at least a portion thereof externally exposed from the perimeter of back electrode type solar cell 30. Thus, when insulating resin 17 is cured between back electrode type solar cell 30 and interconnection sheet 10, there is a tendency that gas 71 in voids remaining in insulating resin 17 can more effectively be discharged externally through gap 18 positioned at the opposite ends of alternating array portion 20 in first direction 50.

Furthermore, preferably, length L is smaller than linear distance X by 0.4 mm or more. This ensures that if back electrode type solar cell 30 is misaligned on interconnection sheet 10 when back electrode type solar cell 30 is provided on interconnection sheet 10, alternating array portion 20 can have opposite end gaps 18 in first direction 50 at least partially exposed externally from the perimeter of back electrode type solar cell 30.

Furthermore, the solar cell with the interconnection sheet of the present invention is preferably such that on interconnection sheet 10 at a single alternating array portion 20 gap 18 between the end of wire for n type 12 at the opposite side of first connecting wire 14a and second connecting wire 14b and gap 18 between the end of wire for p type 13 at the opposite side of second connecting wire 14b and first connecting wire 14a both have at least a portion thereof externally exposed from the perimeter of back electrode type solar cell 30 provided on alternating array portion 20. In this case, when insulating resin 17 is cured between back electrode type solar cell 30 and interconnection sheet 10, there is a tendency that gas 71 in voids remaining in insulating resin 17 can more effectively be discharged externally through gap 18 positioned at the opposite ends of alternating array portion 20 in first direction 50.

Furthermore, such a solar cell with an interconnection sheet is more preferable that on interconnection sheet 10 at a single alternating array portion 20 any gaps 18 between the end of wire for n type 12 at the opposite side of first connecting wire 14a and second connecting wire 14b and any gaps 18 between the end of wire for p type 13 at the opposite side of second connecting wire 14b and first connecting wire 14a both have at least a portion thereof externally exposed from the perimeter of back electrode type solar cell 30 provided on alternating array portion 20. If insulating resin 17 between back electrode type solar cell 30 and interconnection sheet 10 is divided in second direction 51 by a partition introduced as an electrode of back electrode type solar cell 30 is connected to a wiring of interconnection sheet 10, gas 71 in the voids remaining in each divided insulating resin 17 can be externally discharged by all gaps 18 positioned at the opposite ends in first direction 50, and this further ensures that back electrode type solar cell 30 and interconnection sheet 10 can be connected together.

Solar Cell Module

FIGS. 13(a) and 13(b) are schematic cross sections for illustrating one example of a method for fabricating a solar cell module in accordance with the present invention. Hereinafter reference will be made to FIG. 13(a) and FIG. 13(b) to describe one example of the method for fabricating the solar cell module in accordance with the present invention.

The following will describe as one example of the present solar cell module a solar cell module having sealed in a sealing material the solar cell with the interconnection sheet as shown in FIG. 8 and FIG. 9.

Initially, as shown in FIG. 13(a), a transparent substrate 40 with first transparent resin 41a in the form of a sheet is positioned closer to back electrode type solar cell 30 with the interconnection sheet shown in FIGS. 8 and 9, and a back surface protection sheet 42 with second transparent resin 41b in the form of a sheet is positioned closer to interconnection sheet 10 of the solar cell with the interconnection sheet shown in FIGS. 8 and 9.

Then, first transparent resin 41a is pressed into contact with back electrode type solar cell 30 of the solar cell with the interconnection sheet and second transparent resin 41b is pressed into contact with interconnection sheet 10 of the solar cell with the interconnection sheet and they thus undergo a heat treatment and are thus cured integrally. Thus, as shown in FIG. 13(b), first transparent resin 41a and second transparent resin 41b are integrated together to provide sealing material 41 sealing the solar cell with the interconnection sheet and thus fabricate one example of the present solar cell module.

Herein if in curing first transparent resin 41a and second transparent resin 41b insulating resin 17 of the solar cell with the interconnection sheet is cured, then, initially, decompression is provided in the configuration shown in FIG. 13(a), and air or a similar gas between adjacent strips of resin composition 17 applied is discharged through gap 18. Subsequently, preferably, first transparent resin 41a is soften to seal gap 18 and resin composition 17a is then liquefied. Subsequently, insulating resin 17, first transparent resin 41a, and second transparent resin 41b are cured. This allows back electrode type solar cell 30 and interconnection sheet 10 to be bonded together without gas, such as air, introduced between back electrode type solar cell 30 and interconnection sheet 10 and can also suppress insulating resin 17 flowing out between back electrode type solar cell 30 and interconnection sheets 10, and the solar cell module can be enhanced in reliability.

Furthermore, the solar cell module fabricated as described above is fabricated with the solar cell with the interconnection sheet that has interconnection sheet 10 that satisfies expression (1), and can also have improved characteristics as a solar cell module.

Note that the solar cell with the interconnection sheet can be sealed in sealing material 41 through press and a heat treatment for example using equipment referred to as a laminator performing vacuum press and a heat treatment. For example, the laminator is employed to thermally deform first transparent resin 41a and second transparent resin 41b and thermally set first transparent resin 41a and second transparent resin 41b to integrate the transparent resins together to provide sealing material 41 to encapsulate and thus seal the solar cell with the interconnection sheet therein to fabricate a solar cell module.

Herein, vacuum press is press performed in an atmosphere smaller in pressure than the atmospheric pressure. Furthermore, performing the press by vacuum press is preferable in that it provides a tendency that first transparent resin 41a and second transparent resin 41b have less voids formed therebetween and sealing material 41 formed of first transparent resin 41a and second transparent resin 41b integrated together have less gaseous voids remaining therein.

Note that transparent substrate 40 may be any substrate that is transparent for solar light and it can for example be a glass substrate.

Furthermore, first transparent resin 41a and second transparent resin 41b may be any resin that is transparent for solar light, and inter alia, at least one type of transparent resin selected from the group consisting of ethylene vinyl acetate resin, epoxy resin, acrylic resin, urethane resin, olefin resin, polyester resin, silicone resin, polystyrene resin, polycarbonate resin and rubber resin is preferable. In that case, sealing material 41 is excellent in weather resistance and enhanced in permeability for solar light, and can be fixed to transparent substrate 40 with sufficient strength without significantly impairing the solar cell module's output (a short circuit electric current, or a current in operation, in particular). This provides a tendency ensuring that the solar cell module is reliable for a long term.

Furthermore, first transparent resin 41a and second transparent resin 41b may be identical or different in type.

Furthermore, when the above solar cell module is sealed in sealing material 41 through a heat treatment and for example first transparent resin 41a and second transparent resin 41b are both ethylene vinyl acetate (EVA) resin, the heat treatment can be performed to heat first transparent resin 41a and second transparent resin 41b for example to a range of 100° C. to 200° C.

Furthermore, back surface protection sheet 42 can be any that can protect a back surface of sealing material 41, and can for example be a conventionally used weatherproof film such as PET.

Furthermore, back surface protection sheet 42 may include metallic film for example of aluminum or the like in order to sufficiently suppress water vapor, oxygen and/or the like transmitted into sealing material 41 and thus ensure long-term reliability.

Furthermore, for the solar cell module's end surface, to which it is difficult to closely attach back surface protection sheet 42, moisture-proof tape such as butyl rubber tape can be used to completely closely attach back surface protection sheet 42 thereto.

Furthermore, one example of the present solar cell module thus fabricated may have a frame for example of aluminum alloy attached to surround the solar cell module peripherally.

FIGS. 14(a) and 14(b) are schematic cross sections for illustrating another example of the method for fabricating the solar cell module in accordance with the present invention. Hereinafter reference will be made to FIGS. 14(a) and 14(b) to describe the other example of the method for fabricating the solar cell module in accordance with the present invention. The following will also describe as another example of the present solar cell module a solar cell module having sealed in a sealing material the solar cell with the interconnection sheet configured as shown in FIG. 8 and FIG. 9.

Initially, as shown in FIG. 14(a), back surface protection sheet 42 is alone disposed adjacent to interconnection sheet 10 of the solar cell with the interconnection sheet, and transparent substrate 40 with first transparent resin 41a in the form of a sheet is disposed adjacent to back electrode type solar cell 30 of the solar cell with the interconnection sheet.

Subsequently, first transparent resin 41a is pressed to back electrode type solar cell 30 of the solar cell with the interconnection sheet and in that condition undergoes a heat treatment to encapsulate and thus seal the solar cell with the interconnection sheet in first transparent resin 41a, as shown in FIG. 14(b). First transparent resin 41a thus seals the solar cell with the interconnection sheet therein and one example of the present solar cell module is thus fabricated.

Back electrode type solar cell 30 of the solar cell module thus fabricated receives light at the photoreceptive surface, and thereby generates an electric current, which is in turn extracted through electrode for n type 34 and electrode for p type 35 of back electrode type solar cell 30 to wire for n type 12 and wire for p type 13 of interconnection sheet 10. Wire for n type 12 and wire for p type 13 of interconnection sheet 10 receive the electric current, which is in turn extracted externally through terminals 14c, 14d (see FIG. 8) of wiring 16 of interconnection sheet 10.

EXAMPLES

Preparing Samples

Initially, as shown in FIG. 1 and FIG. 2, wiring 16 formed of copper patterned in the form shown in FIG. 1 was provided on a surface of PEN film serving as insulating base material 11 to prepare interconnection sheet 10.

Note that as interconnection sheet 10, as shown in the schematic side view of FIG. 5, interconnection sheet 10 unrolled from and cut off an interconnection sheet roll of elongate interconnection sheet 10 in a predetermined length, which had wiring 16 patterned as shown in FIG. 1 and successively provided on a surface of insulating base material 11 and was rolled on core 22, was used.

Herein, interconnection sheet 10 of a sample A was produced to have a single alternating array portion 20 such that when X represents a maximum linear distance from connection portion 21a connecting first connecting wire 14a and wire for n type 12 to connection portion 21b connecting second connecting wire 14b and wire for p type 13, Y represents a maximum length of alternating array portion 20 in first direction 50, and Z represents a maximum length of alternating array portion 20 in second direction 51, as shown in FIG. 2, X, Y, and Z satisfy a relationship represented by the following expression (1):

$$Y \leq Z < X \tag{1},$$

and there was gap 18.

More specifically, in interconnection sheet 10 of sample A, values X, Y, and Z are X=126.65 mm, Y=124.4 mm, and Z=126.2 mm, respectively, and thus satisfy the above expression (1).

Furthermore, interconnection sheet 10 of a sample B was produced to have values X, Y, and Z satisfying the following expression (2):

$$Y < X < Z \tag{2},$$

and to have gap 18.

More specifically, in interconnection sheet 10 of sample B values X, Y, and Z are X=123.00 mm, Y=122.0 mm, and Z=124.25 mm, respectively, and thus satisfy the above expression (2).

Note that while FIG. 1 shows alternating array portion 20 of FIG. 2 provided in two rows in first direction 50 and in two columns in second direction 51 to provide wiring 16, interconnection sheets 10 of samples A and B were provided with alternating array portion 20 of FIG. 2 in 11 rows in first direction 50 and in two columns in second direction 51 for wiring 16.

Subsequently, as shown in FIG. 6, an n type silicon substrate which had a photoreceptive surface and a back surface in a square having each side of 126 mm and having four corners removed and had a thickness of 200 μm was prepared as semiconductor substrate 31.

Then, the n type silicon substrate is provided at its back surface with n type impurity diffusion region 32 implemented as a strip-shaped n type impurity doped region doped with phosphorus and p type impurity diffusion region 33 implemented as a strip-shaped p type impurity doped region doped with boron, one by one alternately with a predetermined distance therebetween.

Subsequently, silicon oxide film was provided through plasma CVD as passivation film 36 across the back surface of the n type silicon substrate. Then, a textured structure or a similar, uneven structure was formed across the photoreceptive surface of the n type silicon substrate. Thereafter, silicon nitride film was provided through plasma CVD as anti-reflection film 37 on the uneven structure.

Subsequently, the silicon oxide film on the back surface of the n type silicon substrate was partially removed to form a contact hole, and thereafter, as shown in FIG. 7, a strip-shaped silver electrode was formed as electrode for n type 34 on the n type impurity doped region exposed at a contact hole and a strip-shaped silver electrode was formed as electrode for p type 35 on the p type impurity doped region exposed at a contact hole to fabricate back electrode type solar cell 30.

Note that sample A was prepared such that electrode for n type 34 of back electrode type solar cell 30 of sample A and wire for n type 12 of interconnection sheet 10 of sample A matched in geometry and electrode for p type 35 of back electrode type solar cell 30 of sample A and wire for p type 13 of interconnection sheet 10 of sample A matched in geometry.

Furthermore, sample B was prepared such that electrode for n type 34 of back electrode type solar cell 30 of sample B and wire for p type 12 of interconnection sheet 10 of sample B matched in geometry and electrode for p type 35 of back electrode type solar cell 30 of sample B and wire for p type 13 of interconnection sheet 10 of sample B matched in geometry.

Subsequently, as shown in FIG. 10(a), solder paste including epoxy resin as insulating resin 17 and solder as electrically conductive adhesive 25 was applied as resin composition 17a on a surface of wire for n type 12 and a surface of wire for p type 13 of interconnection sheet 10 of sample A. Furthermore, solder paste including epoxy resin as insulating resin 17 and solder as electrically conductive adhesive 25 was also applied as resin composition 17a on a surface of wire for n type 12 and a surface of wire for p type 13 of interconnection sheet 10 of sample B.

Then, as shown in FIG. 10(b), 22 back electrode type solar cells 30 of sample A were provided on wiring 16 of interconnection sheet 10 of sample A such that electrode for n type 34 of back electrode type solar cell 30 of sample A was electrically connected on wire for n type 12 of interconnection sheet 10 of sample A via electrically conductive adhesive 25 and electrode for p type 35 of back electrode type solar cell 30 of sample A was electrically connected on wire for p type 13 of interconnection sheet 10 of sample A via electrically conductive adhesive 25 to fabricate a solar cell with an interconnection sheet of sample A.

Furthermore, similarly as has been done in fabricating the solar cell with the interconnection sheet of sample A, 22 back electrode type solar cells 30 of sample B were provided on wiring 16 of interconnection sheet 10 of sample B to fabricate a solar cell with an interconnection sheet of sample B.

Note that the solar cell with the interconnection sheet of sample A was fabricated with back electrode type solar cell 30 provided on interconnection sheet 10 such that gap 18 was at least partially, externally exposed from the perimeter of back electrode type solar cell 30, as shown in FIG. 11. The solar cell with the interconnection sheet of sample B did not have any gap 18 externally exposed from the perimeter of back electrode type solar cell 30.

Then, as shown in FIG. 13(a) and FIG. 13(b), the solar cell with the interconnection sheet of sample A was inserted between EVA resin serving as first transparent resin 41a provided on one surface of the glass substrate serving as transparent substrate 40 and EVA resin serving as second transparent resin 41b provided on one surface of back surface protection sheet 42, and the solar cell with the interconnection sheet of sample A was vacuum-pressed and thus sealed in the EVA resin serving as sealing material 41 to complete a solar cell module of sample A. Vacuum press was done as follows: after evacuation was performed for 1 minute, a pressure of 1 atmosphere was applied while evacuation was performed, and a temperature of 150° C. was held for 6 minutes to thermally set insulating resin 17, and thereafter, furthermore, the EVA resin was heated at 150° C. for 10 minutes and thus thermally set to reach a predetermined a crosslinking ratio.

Furthermore, a solar cell module of sample B was also fabricated with the solar cell with the interconnection sheet of sample B in a manner similar to that of fabricating the solar cell module of sample A.

Evaluating Samples

The solar cell module of sample A produced as described was fabricated allowing back electrode type solar cell 30 and interconnection sheet 10 to be connected together without gaseous voids remaining between back electrode type solar cell 30 and interconnection sheet 10. In contrast, the solar cell module of sample B was observed to have gaseous voids remaining therein in some cases.

It should be understood that the embodiments and examples disclosed herein are illustrative and non-restrictive in any respect. The scope of the present invention is defined by the terms of the claims, rather than the description above, and is intended to include any modifications within the scope and meaning equivalent to the terms of the claims.

INDUSTRIAL APPLICABILITY

The present invention is applicable to interconnection sheets, solar cells with the interconnection sheets, solar cell modules, and interconnection sheet rolls.

REFERENCE SIGNS LIST

10: interconnection sheet, 11: insulating base material, 12: wire for n type, 13: wire for p type, 14a: first connecting wire, 14b: second connecting wire, 14c, 14d: terminal, 16: wiring, 17: insulating resin, 17a: resin composition, 18: gap, 20: alternating array portion, 21a and 21b: connection portion, 22: core, 25: electrically conductive adhesive, 30: back electrode type solar cell, 31: semiconductor substrate, 32: n type impurity diffusion region, 33: p type impurity diffusion region, 34: electrode for n type, 35: electrode for p type, 36: passivation film, 37: anti-reflection film, 38: electrode-absent portion, 40: transparent substrate, 41: sealing material, 41a: first transparent resin, 41b: second transparent resin, 42: back surface protection sheet, 50: first direction, 51: second direction, 71: gas.

The invention claimed is:
1. A solar cell with an interconnection sheet, comprising:
a back electrode type solar cell having a semiconductor substrate and an electrode for n type and an electrode for p type disposed at one surface of said semiconductor substrate; and
an interconnection sheet having an insulating base material and a wiring disposed at one surface of said insulating base material, said wiring having a plurality of strip-shaped wires for n type each for connecting said electrode for n type of said back electrode type solar cell, a plurality of strip-shaped wires for p type each for connecting said electrode for p type of said back electrode type solar cell, a first connecting wire electrically connected to one end of each of said plurality of strip-shaped wires for n type, and a second connecting wire electrically connected to one end of each of said plurality of strip-shaped wires for p type, said plurality of strip-shaped wires for n type and said plurality of strip-shaped wires for p type extending in a first direction, said first connecting wire and said second connecting wire extending in a second direction different from said first direction, said plurality of strip-shaped wires for n type and said plurality of strip-shaped wires for p type being mutually spaced and disposed in said second direction to configure an alternating array portion, at least five gaps being exposed from opposite perimeters of said back electrode type solar cell, each one of said at least five gaps being provided in a region between an end of one of said plurality of strip-shaped wires for n type at the opposite side of said first connecting wire and said second connecting wire or in a region between an end of one of said plurality of strip-shaped wires for p type at the opposite side of said second connecting wire and said first connecting wire, said plurality of strip-shaped wires for n type of said interconnection sheet and said electrode for n type of said back electrode type solar cell electrically connected to each other, and said plurality of strip-shaped wires for p type of said interconnection sheet and said electrode for p type of said back electrode type solar cell electrically connected to each other.

2. A solar cell module comprising a solar cell with an interconnection sheet recited in claim 1.

3. A solar cell with an interconnection sheet, comprising:

a back electrode type solar cell having a semiconductor substrate and an electrode for n type and an electrode for p type disposed at one surface of said semiconductor substrate; and an interconnection sheet having an insulating base material and a wiring disposed at one surface of said insulating base material, said wiring having a plurality of strip-shaped wires for n type each for connecting said electrode for n type of said back electrode type solar cell, a plurality of strip-shaped wires for p type each for connecting said electrode for p type of said back electrode type solar cell, a first connecting wire electrically connected to one end of each of said plurality of wires for n type, and a second connecting wire electrically connected to one end of each of said plurality of wires for p type, said plurality of strip-shaped wires for n type and said plurality of strip-shaped wires for p type extending in a first direction, said first connecting wire and said second connecting wire extending in a second direction different from said first direction, said plurality of strip-shaped wires for n type and said plurality of strip-shaped wires for p type being mutually spaced and disposed in said second direction to configure an alternating array portion, at least five gaps being exposed from opposite perimeters of said back electrode type solar cell, each one of said at least five gaps being provided in a region between an end of one of said plurality of strip-shaped wires for n type at the opposite side of said first connecting wire and said second connecting wire or in region between an end of one of said plurality of strip-shaped wires for p type at the opposite side of said second connecting wire and said first connecting wire, said plurality of strip-shaped wires for n type of said interconnection sheet and said electrode for n type of said back electrode type solar cell electrically connected to each other, said plurality of strip-shaped wires for p type of said interconnection sheet and said electrode for p type of said back electrode type solar cell electrically connected to each other, and wherein a maximum linear distance X in said first direction from a connection portion connecting said plurality of strip-shaped wires for n type and said first connecting wire to a connection portion connecting said plurality of strip-shaped wires for p type and said second connecting wire, a maximum length Y of said alternating array portion in said first direction, and a maximum length Z of said alternating array portion in said second direction satisfying a relationship of $Y \leq Z < X$.

* * * * *